(12) United States Patent
Li et al.

(10) Patent No.: US 11,980,003 B2
(45) Date of Patent: May 7, 2024

(54) SERVER DEVICE SELF-ADAPTIVE IN STRUCTURE TO DIFFERENT PLACEMENTS AND LOCATIONS

(71) Applicant: Fulian Precision Electronics (Tianjin) Co., LTD., Tianjin (CN)

(72) Inventors: Han-Yu Li, New Taipei (TW); Bin-Bin Yang, Tianjin (CN); Jin-Wei Zhang, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 343 days.

(21) Appl. No.: 17/564,631

(22) Filed: Dec. 29, 2021

(65) Prior Publication Data

US 2023/0082042 A1    Mar. 16, 2023

(30) Foreign Application Priority Data

Sep. 16, 2021    (CN) .......................... 202111089108.9

(51) Int. Cl.
*H05K 7/20*    (2006.01)
*H05K 7/14*    (2006.01)

(52) U.S. Cl.
CPC ....... *H05K 7/1489* (2013.01); *H05K 7/20709* (2013.01)

(58) Field of Classification Search
CPC .......................... H05K 7/20709; H05K 7/1489
See application file for complete search history.

(56) References Cited

U.S. PATENT DOCUMENTS 10,939,581 B1 *    3/2021    Chen .................. H05K 7/20781

FOREIGN PATENT DOCUMENTS

| CN | 108241412 A | 7/2018 |
|----|-------------|--------|
| TW | 200836612 A | 9/2008 |
| TW | M432067 U   | 6/2012 |
| TW | 202130259 A | 8/2021 |

\* cited by examiner

*Primary Examiner* — Sherman Ng
(74) *Attorney, Agent, or Firm* — ScienBiziP, P.C.

(57) ABSTRACT

A server device which is self-adaptive to different placements and locations includes a chassis, a plurality of storage elements, and a storage cabinet. First and third slide rails are positioned at opposite sides of the storage cabinet along a first direction. Second and fourth slide rails are positioned at other two opposing sides of the storage cabinet. The storage cabinet is movably positioned in the chassis along a third direction. When the chassis is horizontal, the first slide rail and the third slide rail provide support for the storage cabinet and when the chassis is vertical, support is provided by the second and fourth slide rails. The problem of the storage cabinet being difficult to slide when the placement of the chassis is changed is reduced, and the server device is more flexible in its placement.

14 Claims, 10 Drawing Sheets

_US 11,980,003 B2_

SERVER DEVICE SELF-ADAPTIVE IN STRUCTURE TO DIFFERENT PLACEMENTS AND LOCATIONS

FIELD

The subject matter herein relates to a server device.

BACKGROUND

Due to the increasing demand for data storage, server device with high-density storage has become the mainstream in the market. Most of cabinets used in the market are non-standard cabinets, and the installation direction of server device is diversified. The installation direction of one single server can only correspond to one type of cabinet and cannot be installed in other types of cabinets.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DESCRIPTION OF MAIN COMPONENTS OR ELEMENTS

Figure 1:
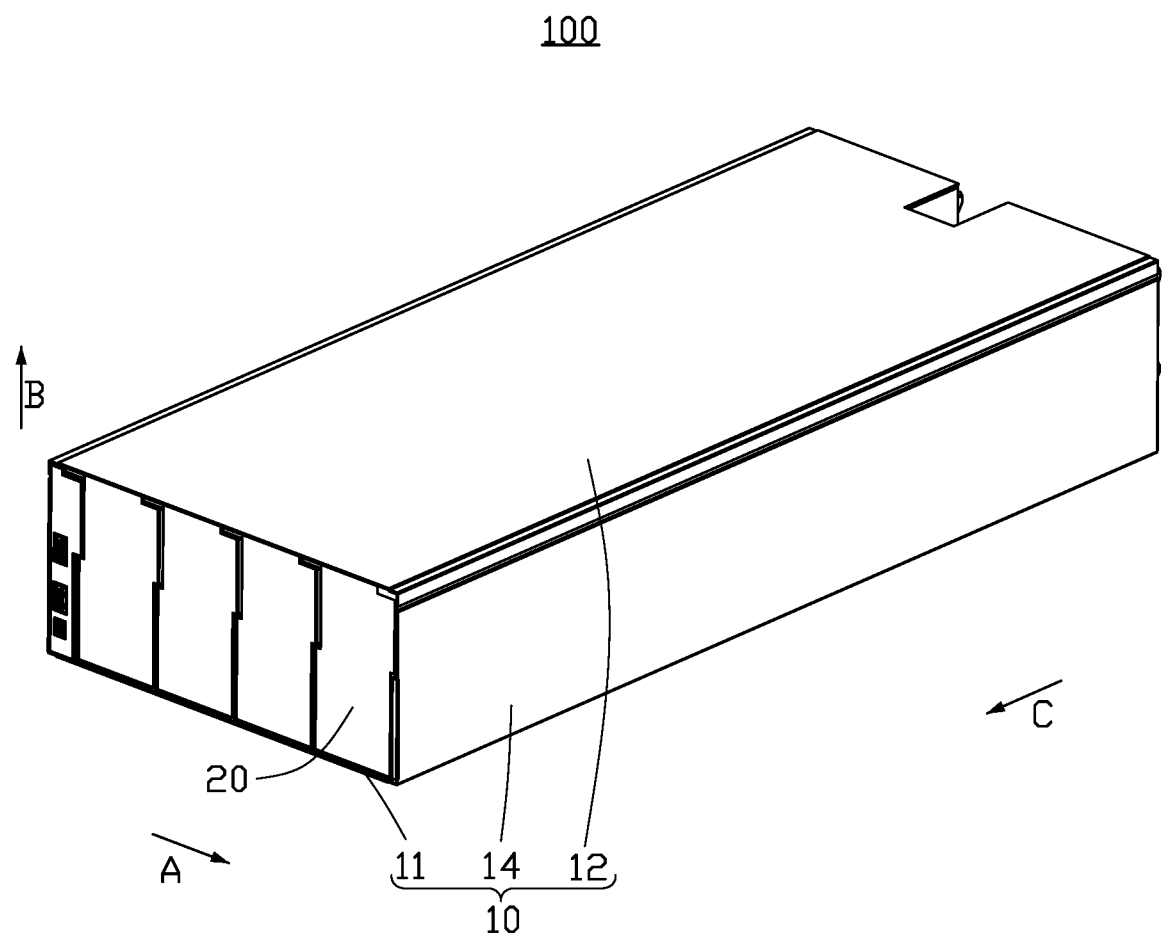
FIG. 1 is a schematic view of a server device in an embodiment of the present disclosure.

Server device 100;
Chassis 10;
Base plate 11;
Cover plate 12;
First side plate 13;
Interface structure 131;
Second side plate 14;
Support plate 15;
First groove 151;
Second groove 152;
Second connecting portion 153;
Extending portion 154;
Guiding member 16;
Guiding groove 161;
Storage cabinet 20;
Bottom wall 21;
First end wall 22;
Second end wall 23;
First side wall 24;
Second side wall 25;
First connecting portion 241;
Storage element 30;
First slide rail 40;
First outer rail 41;
First middle rail 42;
First inner rail 43;
Second slide rail 50;
Second outer rail 51;
Second middle rail 52;
Second inner rail 53;
Third slide rail 60;
Forth slide rail 70;
Radiator 80;
Cable protector 90.

DETAILED DESCRIPTION

In order to make the above-mentioned objects, features, and advantages of the present disclosure more obvious, a description of specific embodiments of the present disclosure will be described with reference to the accompanying drawings. The present disclosure can be implemented in many ways different from those described herein, and those skilled in the art can make similar improvements without violating the contents of the present disclosure. Therefore, the present disclosure is not to be considered as limiting the scope of the embodiments to those described herein.

Several definitions that apply throughout this disclosure will now be presented.

Unless otherwise defined, all technical and scientific terms used herein have the same meaning as commonly understood by one skilled in the art. The terms used in a specification of the present disclosure herein are only for describing specific embodiments, and are not intended to limit the present disclosure.

The application provides a server device, which comprises a chassis, a plurality of storage elements, and a storage cabinet. The storage elements are detachably positioned in the chassis. Along a first direction, a first slide rail and a third slide rail are respectively positioned at opposite two first sides of the storage cabinet. Along a second direction, a second slide rail and a fourth slide rail are respectively positioned at opposite two second sides of the storage cabinet. The storage cabinet is movably positioned in the chassis along a third direction. The first direction, the second direction, and the third direction are perpendicular to each other, and the storage elements are movably positioned in the storage cabinet along the second direction.

When the chassis of the server device is placed horizontally, the first slide rail and the third slide rail provide support for the storage cabinet. When the chassis of the server device is placed vertically, the second slide rail and the fourth slide rail provide support for the storage cabinet. Therefore, the problem of the storage cabinet being difficult to slide, to change the placement of the chassis, is reduced, and placement of server device becomes more flexible, which is conducive to saving some space.

Some embodiments of the present disclosure are described in detail. Without conflict, the following embodiments and features in the embodiments may be combined with each other.

Referring to FIG. 1, FIG. 2, FIG. 8, and FIG. 9, in one embodiment of the present disclosure, a server device 100 includes a chassis 10, a storage cabinet 20, and a plurality of storage elements 30. The storage elements 30 are detachably positioned in the chassis 10. Along a first direction A, a first slide rail 40 and a third slide rail 60 are positioned at opposite two sides of the storage cabinet 20. Along a second direction B, a second slide rail 50 and a fourth slide rail 70 are positioned at other two sides of the storage cabinet 20. The storage cabinet 20 is movably positioned in the chassis 10 along a third direction C. The first direction A, the second direction B, and the third direction C are perpendicular to each other. The storage elements are 30 movably positioned in the storage cabinet 20 along the second direction B. When the storage cabinet 20 is moved out of the chassis 10 along the third direction C, the storage element 30 can be pulled out from or put back into the storage cabinet 20 along the second direction B.

Specifically, the chassis 10 includes a base plate 11, a cover plate 12, and a side plate, and the side plate includes a first side plate 13 and a second side plate 14. Along the first direction A, the first side plate 13 and the second side plate 14 are on opposite sides of the base plate 11. Along the second direction B, the cover plate 12 faces the base plate 11. A plurality of the storage cabinets 20 are positioned in the chassis 10 in parallel, and openings of the storage cabinets 20 are towards the cover plate 12.

Figure 2:
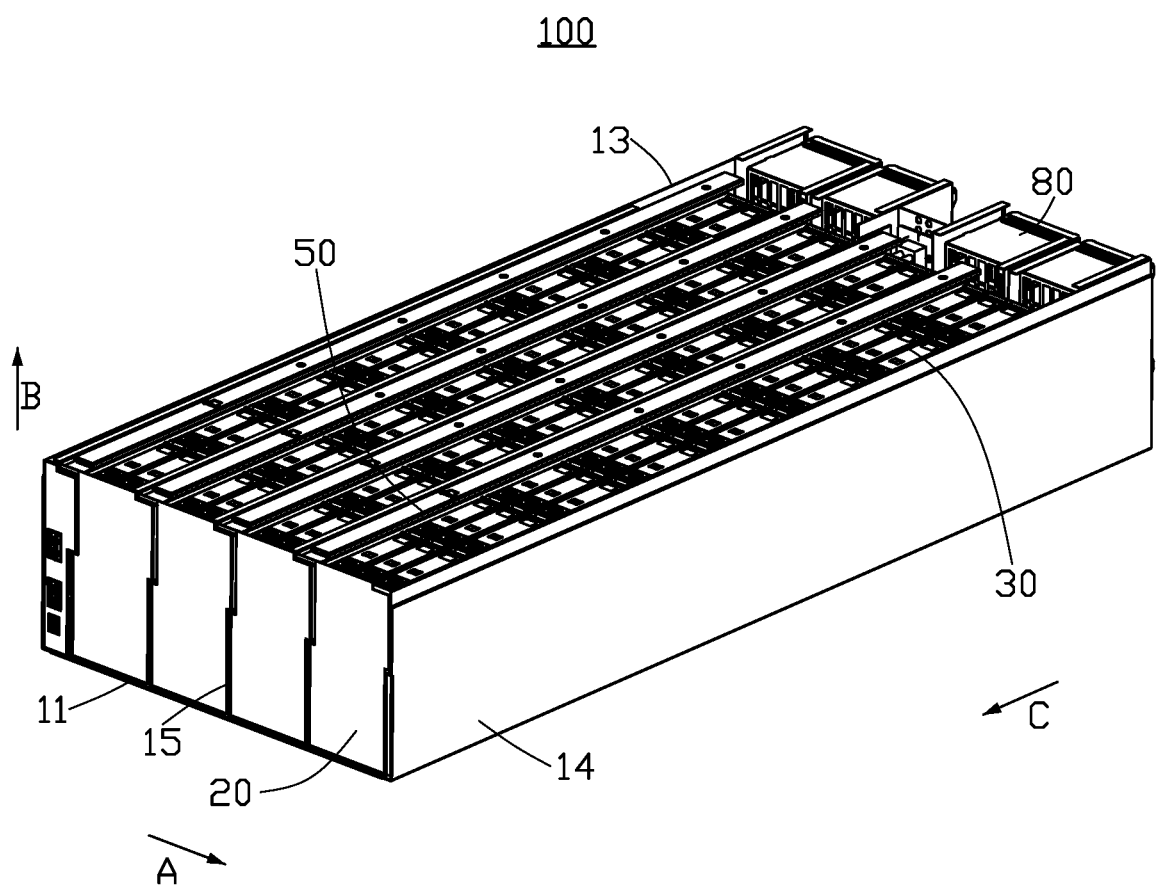
FIG. 2 is a schematic view of the server device of FIG. 1 without cover plate.
Figure 3:
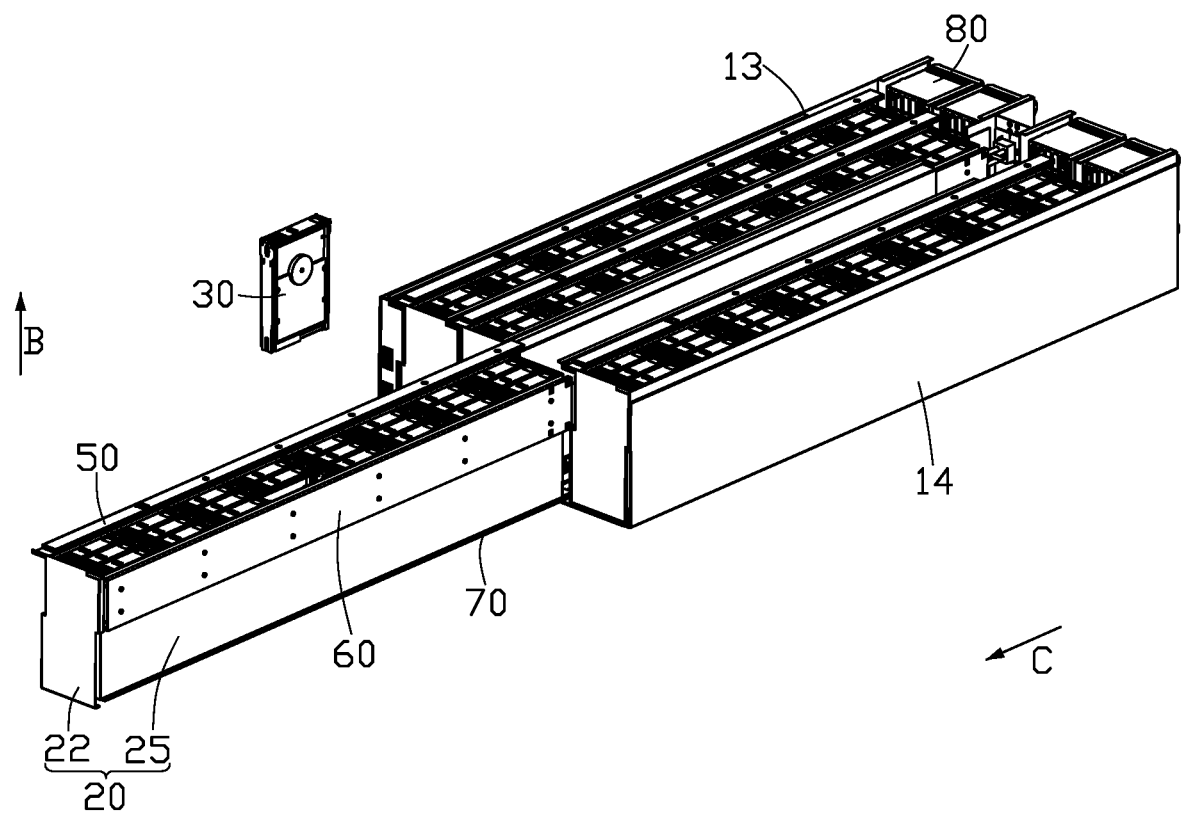
FIG. 3 is a schematic view of the server device of FIG. 2, wherein the server device is placed horizontally and a storage cabinet is removed from a chassis along a third direction.

Referring to FIG. 2 and FIG. 3, when the server device 100 is placed horizontally, the base plate 11 of the chassis 10 acts as a support panel or is in contact with the ground. During movement of the storage cabinet 20 along the third direction C, the first slide rail 40 and the third slide rail 60 support the storage cabinet 20 and guide direction of movement of the storage cabinet 20. At this time, the second slide rail 50 and the fourth slide rail 70 assist in guiding the movement direction of the storage cabinet 20.

Figure 4:
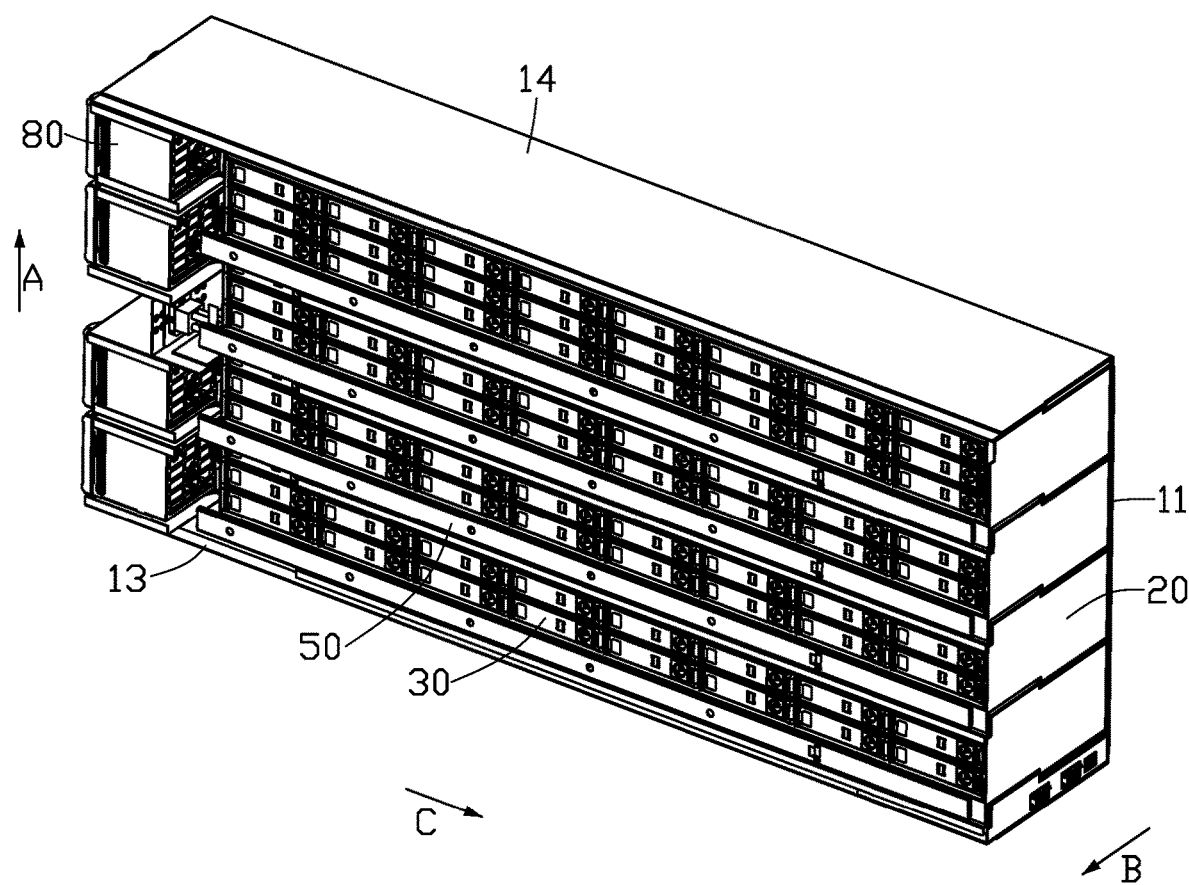
FIG. 4 is a schematic view of the server device of FIG. 2, wherein the server device is vertically placed.
Figure 5:
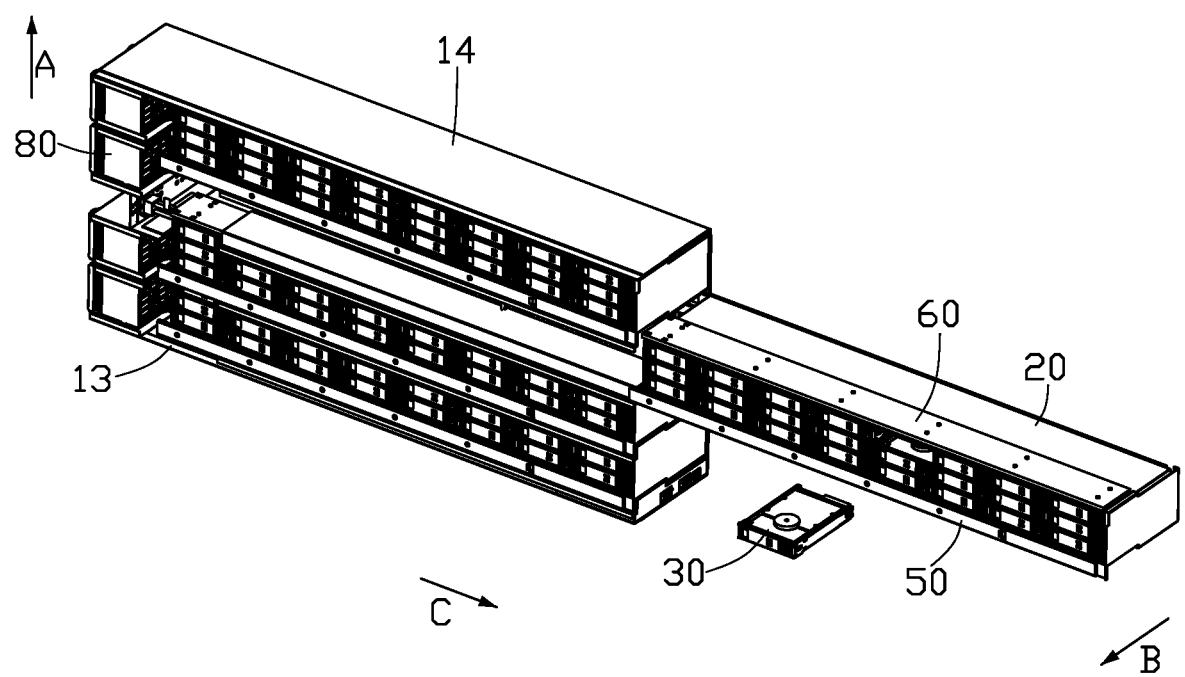
FIG. 5 is a schematic view of the server device of FIG. 4, wherein the storage cabinet is removed from the chassis along the third direction.

Referring to FIG. 4 and FIG. 5, when the server device 100 is placed vertically, the first side plate 13 or the second side plate 14 of the chassis 10 acts as a support panel or is in contact with the ground. The second slide rail 50 and the fourth slide rail 70 support the storage cabinet 20 and guide movement direction of the storage cabinet 20. At this time, the first slide rail 40 and the third slide rail 60 assist in guiding the movement direction of the storage cabinet 20.

Figure 8:
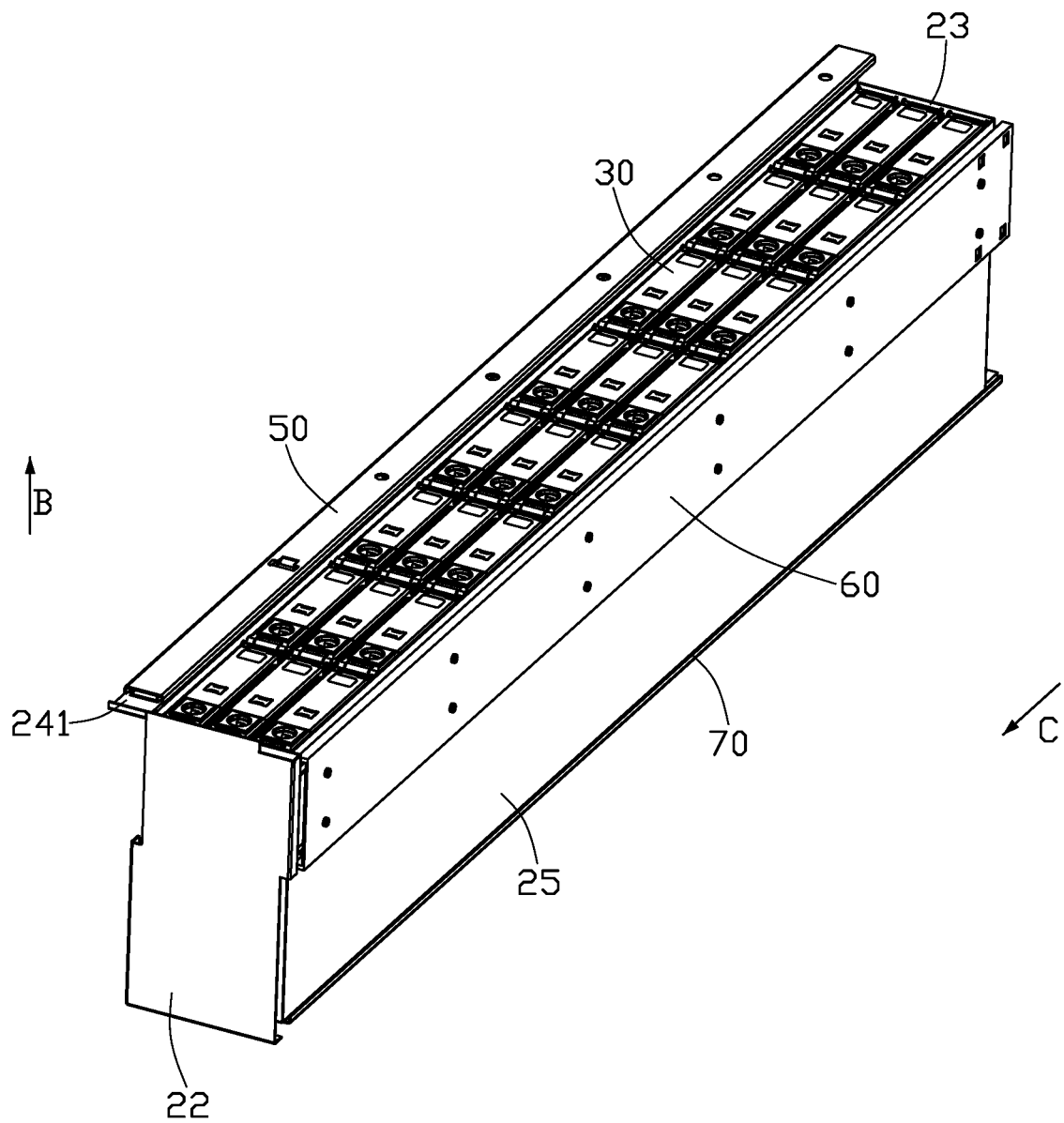
FIG. 8 is a schematic view of part of structure of the server device of FIG. 1.

Furthermore, referring to FIG. 1, FIG. 8 and FIG. 9 again, the storage cabinet 20 includes a bottom wall 21, a first end wall 22, a second end wall 23, a first side wall 24, and a second side wall 25. The first end wall 22, the second end wall 23, the first side wall 24, and the second side wall 25 are positioned around the bottom wall 21. The fourth slide rail 70 is connected between the bottom wall 21 and the base plate 11. The first slide rail 40 is positioned on an outside surface of the first side wall 24. The third slide rail 60 is positioned on an outside surface of the second side wall 25. A first connecting portion 241 is positioned on a side of the first side wall 24 away from the bottom wall 21. The second slide rail 50 is connected between the first connecting portion 241 and the cover plate 12. In the embodiment of the present disclosure, the first connecting portion 241 is parallel to the bottom wall 21, so that the second slide rail 50 is parallel to the fourth slide rail 70.

Figure 7:
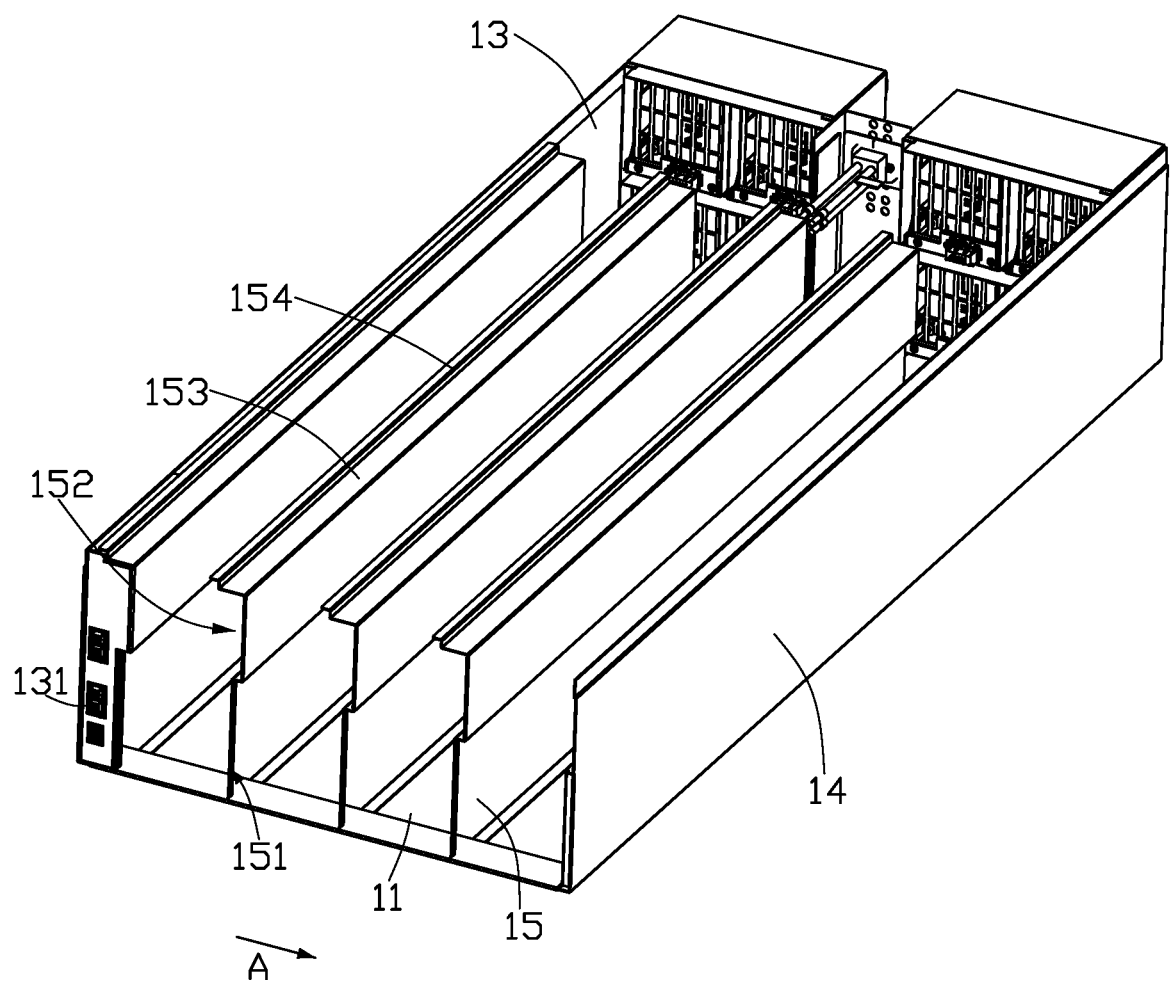
FIG. 7 is a schematic view of the chassis of the server device of FIG. 1.

Furthermore, referring to FIG. 2 and FIG. 7, a support plate 15 is arranged between each two adjacent storage cabinets 20, and the support plate 15 is fixedly connected with the base plate 11. The first slide rail 40 or the third slide rail 60 is connected between the storage cabinet 20 and the support plate 15. Alternatively, the first slide rail 40 or the third slide rail 60 is connected between the storage cabinet 20 and the second side plate 14 of the chassis 10. The second slide rail 50 is connected between the cover plate 12 and the storage cabinet 20. The fourth slide rail 70 is connected between the base plate 11 and the storage cabinet 20. In the embodiment of the present disclosure, one support plate 15 is also positioned between the first side plate 13 and the storage cabinet 20 of the chassis 10. The support plate 15 and the first side plate 13 are spaced apart. Some of the cables of the server device 100 are arranged between the support plate 15 and the first side plate 13. A plurality of connection ports 131 for connecting the cables is positioned at an end of the first side plate 13.

In the embodiment of the present disclosure, along the first direction A, a first groove 151 and a second groove 152 are defined at opposing sides of the support plate 15. The first slide rail 40 is positioned in the first groove 151, and the third slide rail 60 is positioned in the second groove 152. Furthermore, along the second direction B, the projections of the first groove 151 and the second groove 152 on the surface of the chassis 10 overlap, so that space occupied by the support plate 15 in the chassis 10 is reduced.

Figure 9:
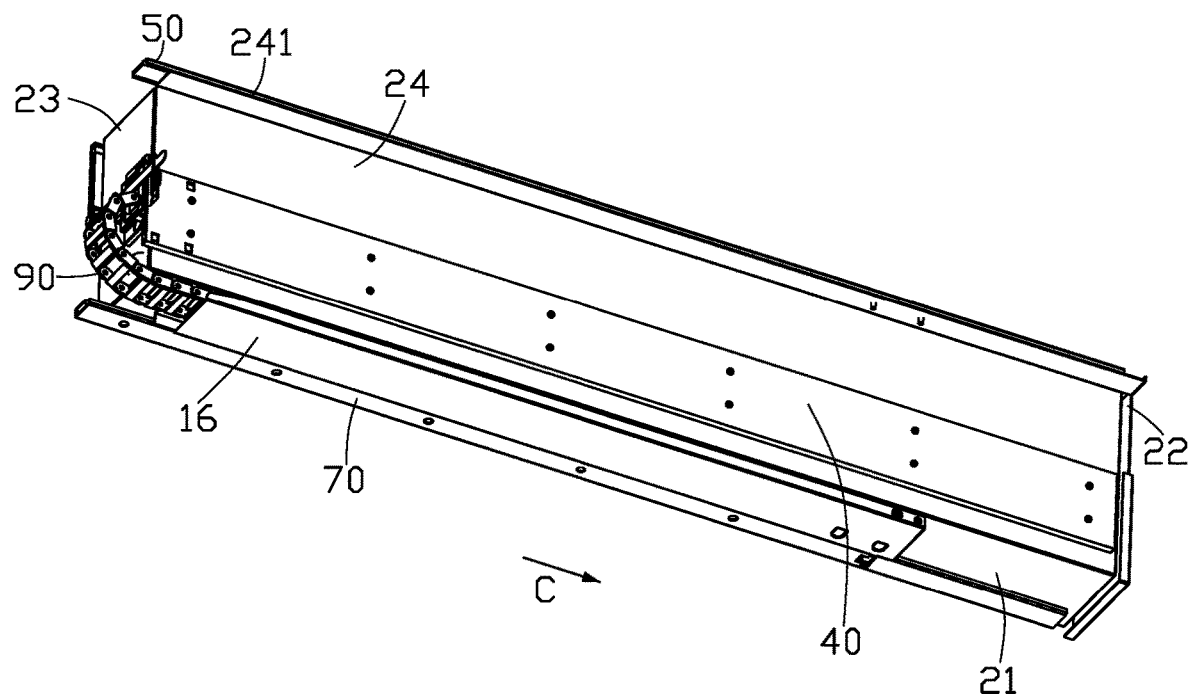
FIG. 9 is a schematic view of the structure of FIG. 8 but viewed from another direction.

Furthermore, referring to FIG. 7, FIG. 8, and FIG. 9, a second connecting portion 153 is positioned at a side of the support plate 15 away from the bottom plate 11. The first connecting portion 241 of the storage cabinet 20 is movably connected with the second connecting portion 153. An extending portion 154 is protruding from a side of the second connecting portion 153. The extending portion 154 abuts edges of the first connecting portion 241 and the second slide rail 50, conducive to the positioning and installation of the first connecting portion 241 and the second slide rail 50.

Figure 10:
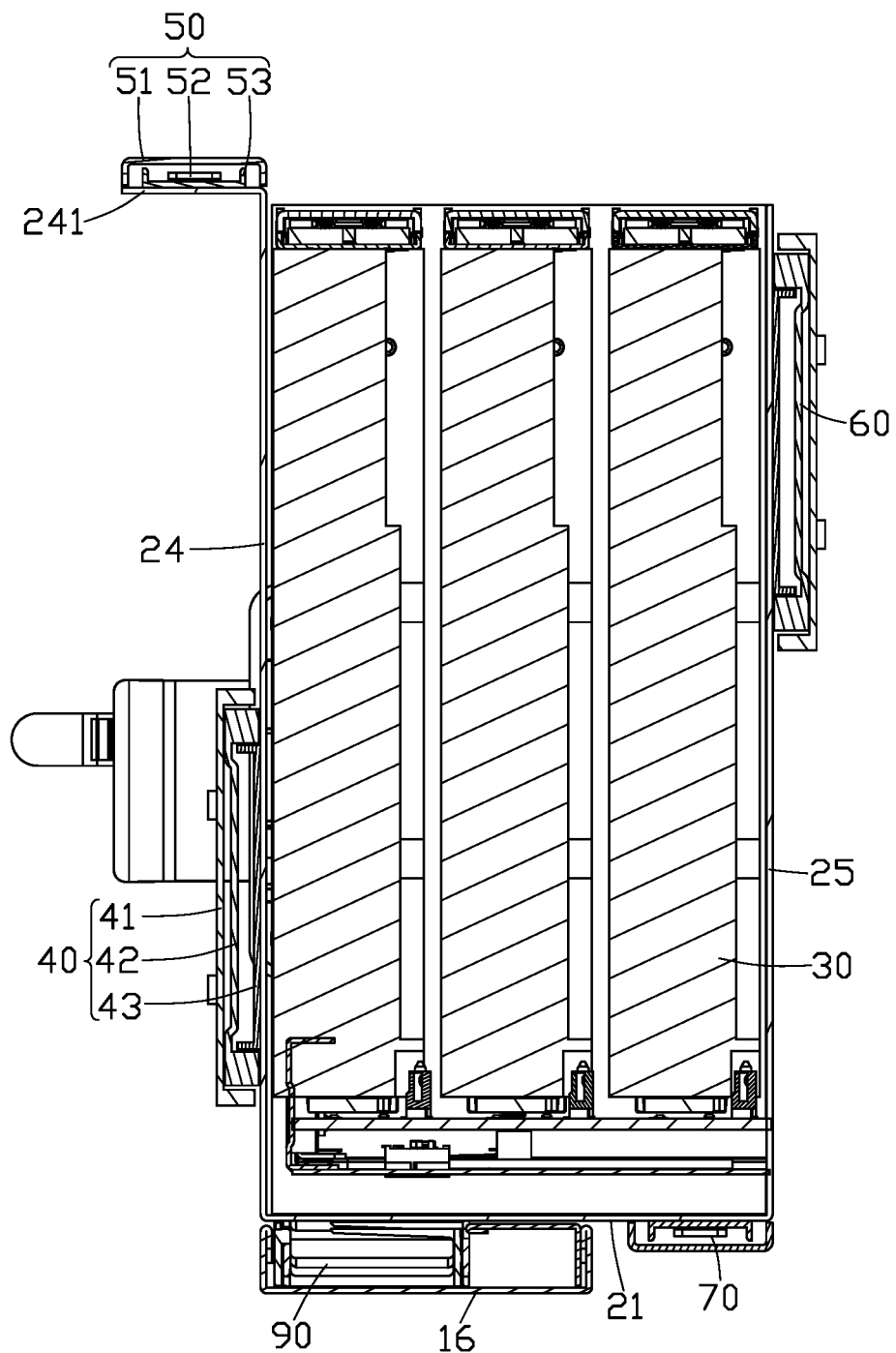
FIG. 10 is a cross section view of the structure shown in FIG. 8.

Referring to FIG. 1 and FIG. 10, in some embodiments of the present disclosure, the first slide rail 40 includes a first outer rail 41, a first middle rail 42, and a first inner rail 43. The first outer rail 41 is fixedly connected with the support plate 15 or with the second side plate 14 of the chassis 10. The first inner rail 43 is fixedly connected with the storage cabinet 20. The first middle rail 42 is movably connected between the first inner rail 43 and the first outer rail 41. The structure of the third slide rail 60 is similar to that of the first slide rail 40.

The second slide rail 50 includes a second outer rail 51, a second middle rail 52, and a second inner rail 53. The second outer rail 51 is fixedly connected with the cover plate 12. The second inner rail 53 is fixedly connected with the first connecting portion 241 of the storage cabinet 20. The second middle rail 52 is movably connected between the second inner rail 53 and the second outer rail 51. The structure of the fourth slide rail 70 is similar to that of the second slide rail 50.

Figure 6:
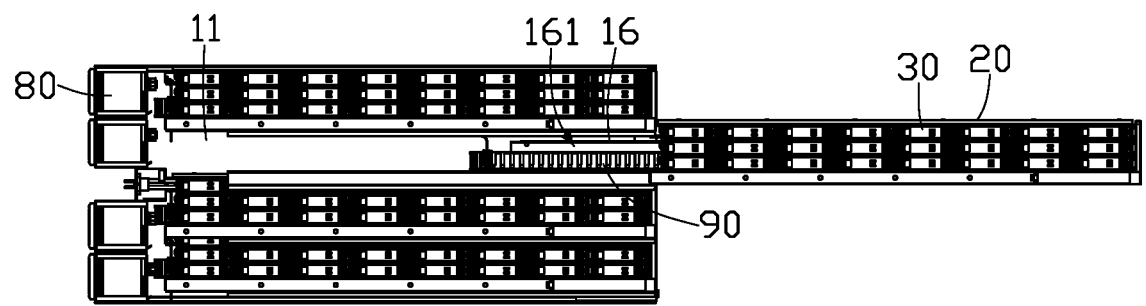
FIG. 6 is a side view of the server device of FIG. 5.

Referring to FIG. 6, FIG. 9, and FIG. 10, in some embodiments of the present disclosure, the chassis 10 includes a guiding member 16, the guiding member 16 is positioned between the storage cabinet 20 and the base plate 11. The server device 100 also includes a cable protector 90. An end of the cable protector 90 is attached to the storage cabinet 20, other end of the cable protector 90 is positioned partially in a guiding groove 161 of the guiding member 16. The cable protector 90 includes but is not limited to a pipeline protection chain. When the storage cabinet 20 is pulled out from the chassis 10, the cable protector 90 moves synchronously with the storage cabinet 20, gradually moving out of the guiding member 16. When the storage cabinet 20 is put back into the chassis 10, the cable protector 90 moves synchronously with the storage cabinet 20 again and gradually moves into the Guide 16. Cables for connecting the storage element 30 may be positioned in the cable protector 90.

Furthermore, the server device 100 further includes a radiator 80. The radiator 80 is located at one end of the storage cabinet 20, and the radiator 80 is fixedly positioned in the chassis 10. In the embodiment of the present disclosure, the number and positions of radiators 80 correspond to the number and positions of the storage cabinets 20, so as to reduce the operating temperature of the storage element 30.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A server device comprising:
    a chassis;
    a plurality of storage elements detachably positioned in the chassis; and
    one or more storage cabinets, each of the storage cabinet comprising a first, a second, a third and a fourth slide rails, wherein along a first direction, the first slide rail and the third slide rail are respectively positioned at opposite two sides of the storage cabinet; along a second direction, the second slide rail and the fourth slide rail are respectively positioned at opposite other two sides of the storage cabinet; the storage cabinet is movably positioned in the chassis along a third direction, and the plurality of storage elements is movably positioned in the storage cabinet along the second direction; the first direction, the second direction and the third direction are perpendicular to each other,
    the chassis comprises a base plate, a cover plate, a first side plate and a second side plate, along the first direction, the first side plate and the second side plate are respectively connected to opposite sides of the base plate, along the second direction, the cover plate faces the base plate, the storage cabinets are positioned in the chassis in parallel,
    the storage cabinet comprises an opening facing the cover plate, and a support plate, the support plate is arranged between each two adjacent storage cabinets, and the support plate is fixedly connected to the base plate; the first slide rail is connected between the storage cabinet and the support plate; or the first slide rail is connected between the storage cabinet and the second side plate; or the third slide rail is connected between the storage cabinet and the support plate; or the third slide rail is connected between the storage cabinet and the second side plate, and
    the second slide rail is connected between the cover plate and the storage cabinet, the fourth slide rail is connected between the base plate and the storage cabinet.

2. The server device of claim 1, wherein the support plate is positioned between the first side plate and the storage cabinet, and the support plate and the first side plate are spaced apart.

3. The server device of claim 2 further comprising a plurality of connection ports positioned at an end of the first side plate, the plurality of connection ports being configured for connecting a plurality of cables between the support plate and the first side plate.

4. The server device of claim 1, wherein the storage cabinet further comprises a bottom wall, a first end wall, a second end wall, a first side wall and a second side wall; the first end wall, the second end wall, the first side wall and the second side wall surround the bottom wall; the fourth slide rail is connected between the bottom wall and the base plate, the first slide rail is positioned on an outside surface of the first side wall, the third slide rail is positioned on an outside surface of the second side wall.

5. The server device of claim 4, wherein the storage cabinet further comprises a first connecting portion is positioned on a side of the first side wall away from the bottom wall, the second slide rail is connected between the first connecting portion and the cover plate.

6. The server device of claim 5, wherein the first connecting portion is parallel to the bottom wall.

7. The server device of claim 5, wherein the second slide rail comprises a second outer rail, a second middle rail and a second inner rail, the second outer rail is fixedly connected with the cover plate, the second inner rail is fixedly connected with the first connecting portion of the storage cabinet, the second middle rail is movably connected between the second inner rail and the second outer rail.

8. The server device of claim 5, wherein the storage cabinet further comprises a second connecting portion positioned at a side of the support plate away from the bottom plate, the first connecting portion of the storage cabinet is movably connected with the second connecting portion.

9. The server device of claim 8, wherein the storage cabinet further comprises an extending portion protruding from a side of the second connecting portion, the extending portion abuts edges of the first connecting portion and the second slide rail.

10. The server device of claim 1, wherein, the chassis further comprises a guiding member, a guiding groove is defined on the guiding member, the guiding member is positioned between the storage cabinet and the base plate; the server device further comprises a cable protector, an end of the cable protector is connected to the storage cabinet, and another end of the cable protector is partially positioned in the guiding groove of the guiding member.

11. The server device of claim 1, wherein, the server device further comprises a radiator, the radiator is located at one end of the storage cabinet, and the radiator is fixedly positioned in the chassis.

12. A server device comprising:
    a chassis;
    a plurality of storage elements detachably positioned in the chassis; and
    one or more storage cabinets, each of the storage cabinet comprising a first, a second, a third and a fourth slide rails, wherein along a first direction, the first slide rail and the third slide rail are respectively positioned at opposite two sides of the storage cabinet: along a second direction, the second slide rail and the fourth slide rail are respectively positioned at opposite other two sides of the storage cabinet; the storage cabinet is movably positioned in the chassis along a third direction, and the plurality of storage elements is movably positioned in the storage cabinet along the second direction; the first direction, the second direction and the third direction are perpendicular to each other,
    the chassis comprises a base plate, a cover plate, a first side plate and a second side plate, along the first direction, the first side plate and the second side plate are respectively connected to opposite sides of the base plate, along the second direction, the cover plate faces the base plate, the storage cabinets are positioned in the chassis in parallel, the storage cabinet comprises an opening facing the cover plate, and a support plate, the support plate is arranged between each two adjacent storage cabinets, and the support plate is fixedly connected to the base plate; the first slide rail is connected between the storage cabinet and the support plate; or the first slide rail is connected between the storage cabinet and the second side plate; or the third slide rail is connected between the storage cabinet and the support plate; or the third slide rail is connected between the storage cabinet and the second side plate, and a first groove and a second groove are respectively defined on two sides of the support plate, the first slide rail is positioned in the first groove, the third slide rail is positioned in the second groove.

13. The server device of claim 12, wherein, the first and the second grooves are defined such that, along the second direction, projections of the first groove and the second groove overlap on a surface of the chassis.

14. The server device of claim 12, wherein the first slide rail comprises a first outer rail, a first middle rail and a first inner rail, the first inner rail is fixedly connected with the storage cabinet, the first middle rail is movably connected between the first inner rail and the first outer rail.

* * * * *